US008577219B2

(12) United States Patent
Nakashima et al.

(10) Patent No.: US 8,577,219 B2
(45) Date of Patent: Nov. 5, 2013

(54) IMAGING APPARATUS AND METHOD OF CALCULATING USABLE TIME OF IMAGING APPARATUS

(75) Inventors: Ryoichi Nakashima, Tokyo (JP); Atsushi Tsuboi, Kanagawa (JP)

(73) Assignee: Sony Corporation, Tokyo (JP)

( * ) Notice: Subject to any disclaimer, the term of this patent is extended or adjusted under 35 U.S.C. 154(b) by 84 days.

(21) Appl. No.: 13/287,286

(22) Filed: Nov. 2, 2011

(65) Prior Publication Data
US 2012/0155849 A1  Jun. 21, 2012

(30) Foreign Application Priority Data

Dec. 21, 2010  (JP) ................................ 2010-284584

(51) Int. Cl.
*G03B 7/26*  (2006.01)
(52) U.S. Cl.
USPC ........................................................ 396/279
(58) Field of Classification Search
USPC .................................................. 396/277, 279
See application file for complete search history.

(56) References Cited

U.S. PATENT DOCUMENTS

| 5,796,239 | A  | * | 8/1998  | van Phuoc et al. | 320/107 |
| 6,041,189 | A  | * | 3/2000  | Izukawa          | 396/277 |
| 6,437,699 | B1 | * | 8/2002  | Hayakawa         | 340/636.13 |
| 6,538,413 | B1 | * | 3/2003  | Beard et al.     | 320/114 |
| 6,674,965 | B2 | * | 1/2004  | Takahashi        | 396/277 |
| 7,157,880 | B2 | * | 1/2007  | Kubota           | 320/106 |
| 7,449,863 | B2 | * | 11/2008 | Tashiro          | 320/112 |
| 7,459,884 | B2 | * | 12/2008 | Sasaki et al.    | 320/132 |
| 2003/0221134 | A1 |   | 11/2003 | Ebato et al.     |         |
| 2010/0315249 | A1 | * | 12/2010 | Imai             | 340/636.12 |
| 2012/0155849 | A1 | * | 6/2012  | Nakashima et al. | 396/301 |

FOREIGN PATENT DOCUMENTS

| JP | 2003-240830 | 8/2003 |
| JP | 2009-44895  | 2/2009 |

OTHER PUBLICATIONS

U.S. Appl. No. 13/274,715, filed Oct. 17, 2011, Nakashima, et al.

* cited by examiner

*Primary Examiner* — W B Perkey
(74) *Attorney, Agent, or Firm* — Oblon, Spivak, McClelland, Maier & Neustadt, L.L.P.

(57) ABSTRACT

An imaging apparatus includes a usable time calculation unit which calculates a usable time of a battery device having a secondary battery, wherein the usable time calculation unit measures an average power level while a component is performed at a predetermined operation mode, wherein the power consumption of the component is unknown in advance before the component is initially connected, and when power is supplied for the second and subsequent times while the component is continuously connected, the usable time calculation unit calculates the usable time of the battery device using the average power level and a current integration value which is an integration value of current flowing during charging and discharging of the battery device.

12 Claims, 12 Drawing Sheets

FIG. 6

| COMMAND | RESPONSE |
|---|---|
| 0x01<br>CURRENT | CURRENT VALUE |
| 0x02<br>VOLTAGE | VOLTAGE VALUE |
| 0x03<br>CURRENT INTEGRATION VALUE | CURRENT INTEGRATION VALUE |

181 — (0x01 CURRENT row, left)
182 — (CURRENT VALUE row, right)
183 — (0x02 VOLTAGE row, left)
184 — (VOLTAGE VALUE row, right)
185 — (0x03 CURRENT INTEGRATION VALUE row, left)
186 — (CURRENT INTEGRATION VALUE row, right)

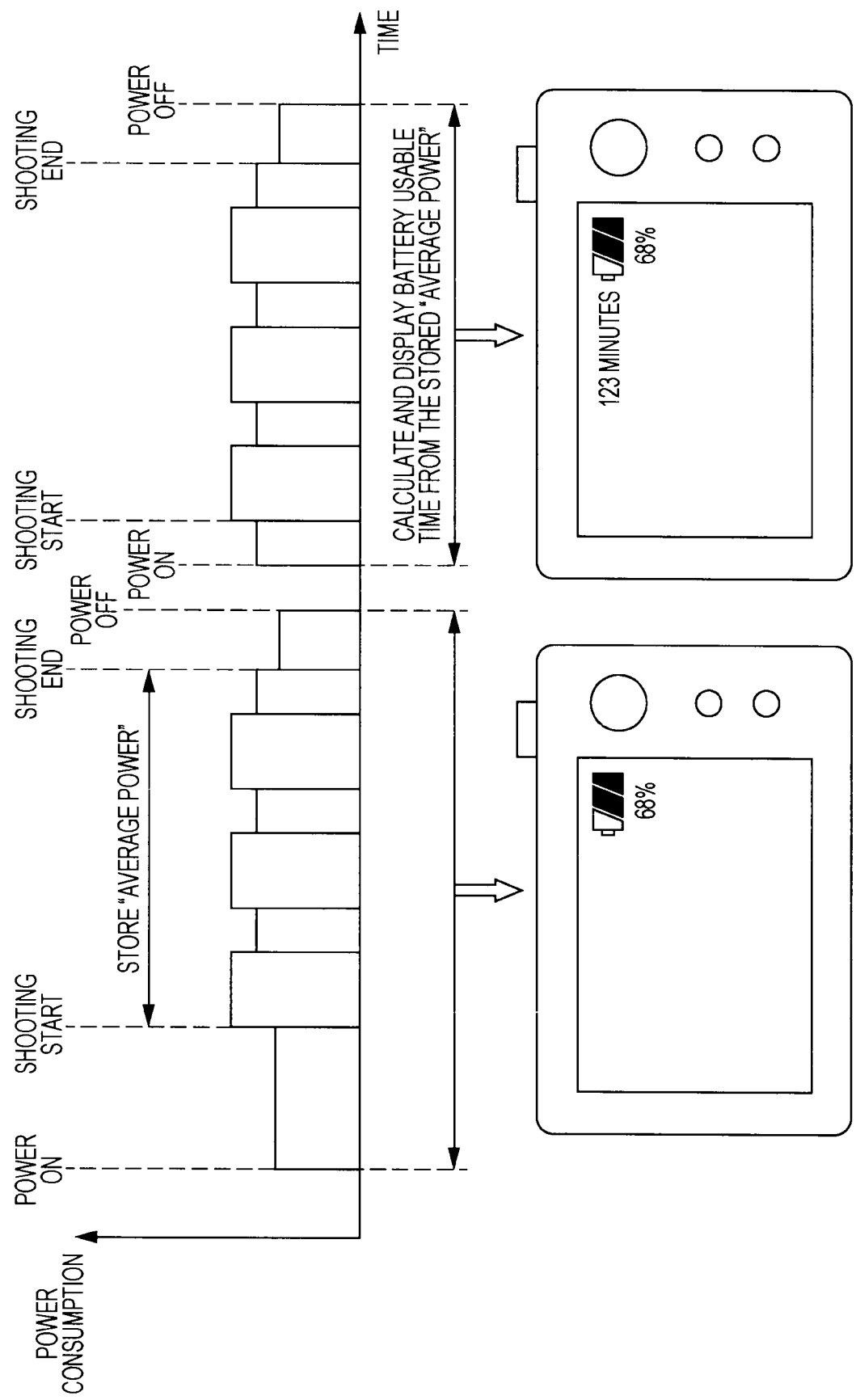

| OPERATIONS OF CAMERA | CONDITION | POWER CONSUMPTION OF CAMERA BODY [mW] | POWER CONSUMPTION WITH INTERCHANGEABLE LENS INCLUDED [mW] | DETERMINATION METHOD OF POWER CONSUMPTION WITH INTERCHANGEABLE LENS INCLUDED |
|---|---|---|---|---|
| VIDEO SHOOTING | HD 1920 | 3500 | 4000 | MEASUREMENT |
|  | HD 1440 | 3300 | 3800 | CALCULATION |
|  | SD | 3100 | 3600 | CALCULATION |
| STILL IMAGE SHOOTING | — | 2800 | 3300 | CALCULATION |
| VIDEO REPRODUCTION | HD 1920 | 2100 | 2100 | CALCULATION |
|  | HD 1440 | 2000 | 2000 | CALCULATION |
|  | SD | 1900 | 1900 | CALCULATION |
| STILL IMAGE REPRODUCTION | — | 1500 | 1500 | CALCULATION |

402 → (OPERATIONS column)
401 → (POWER CONSUMPTION OF CAMERA BODY column)
403 → (POWER CONSUMPTION WITH INTERCHANGEABLE LENS INCLUDED column)

FIG. 11

| CONDITION | POWER CONSUMPTION DIFFERENCE |
|---|---|
| DURING STANDBY | +100 [mW] |
| AUTO FOCUS | +700 [mW] |
| AUTO EXPOSURE | +500 [mW] |

FIG. 12

| CONDITION | TIME RATIO |
|---|---|
| DURING STANDBY | 70% |
| AUTO FOCUS | 20% |
| AUTO EXPOSURE | 10% |

FIG. 13

| CONDITION | TIME RATIO |
|---|---|
| DURING STANDBY | 50% |
| AUTO FOCUS | 30% |
| AUTO EXPOSURE | 20% |

IMAGING APPARATUS AND METHOD OF CALCULATING USABLE TIME OF IMAGING APPARATUS

BACKGROUND

The present disclosure relates to an imaging apparatus and a method of calculating a usable time of an imaging apparatus.

In recent years, portable electronic devices such as digital video cameras have increased in number, and the performance of secondary batteries mounted in such electronic devices has become important. As one of such secondary batteries, there is a battery called a lithium-ion battery.

In addition, many portable electronic devices which use a secondary battery as a power supply as described above have a function of displaying a remaining battery level. In particular, the lithium-ion secondary battery has properties of gradually and linearly reducing a battery cell voltage excluding immediately after the start and immediately before the end of discharge, so that the remaining battery level can be relatively accurately predicted and displayed.

In addition, in order to predict the battery capacity more accurately, battery packs made by accommodating detection circuits of a battery cell voltage or current, a microcontroller which performs various correction processes as described above, and the like in the same packages as battery cells have been made commercially available. Such a battery pack communicates with a device as a discharge load and has a function of outputting various internal detection values to the device, thereby enabling the device that receives the detection values to calculate and display a remaining battery level or a usable time (for example, refer to Japanese Unexamined Patent Application Publications Nos. 2009-44895 and 2003-240830.

SUMMARY

However, in the technique described in Japanese Unexamined Patent Application Publication No. 2009-44895, when a device of which power consumption is unknown in advance, such as an interchangeable lens attached to an interchangeable-lens system camera body is attached to an interchangeable-lens system camera body, there are problems in that the ratio of a remaining capacity of the battery can be known but a usable time may not be known.

In the technique described in Japanese Unexamined Patent Application Publication No. 2003-240830, when a system is formed of a combination of devices alone of which power consumption is known in advance, the power consumption of each device is recorded in a memory in advance, and a battery usable time can be calculated using the values when the devices start operations. However, in the technique described in Japanese Unexamined Patent Application Publication No. 2003-240830, when a device of which power consumption is unknown in advance is attached to an interchangeable-lens system camera body such as an interchangeable lens attached to an interchangeable-lens system camera body, there is a problem in that a usable time may not be known.

In addition, the power consumption of a device such as the interchangeable lens attached to the interchangeable-lens system camera body is changed by a use method of a user. However, the technique described in Japanese Unexamined Patent Application Publication No. 2003-240830 also has a problem in that only a battery usable time when power is consumed by the device at a uniform rate can be calculated.

It is desirable to provide a new or improved imaging apparatus and a method of calculating a usable time of an imaging apparatus, capable of calculating a usable time of a battery even when a device of which power consumption is unknown in advance is connected.

According to an embodiment of the disclosure, there is provided an imaging apparatus including: a usable time calculation unit which calculates a usable time of a battery device having a secondary battery, wherein the usable time calculation unit measures an average power level while a component is performed at a predetermined operation mode, wherein the power consumption of the component is unknown in advance before power is supplied after the component is initially connected, and when power is supplied for the second and subsequent times while the component is continuously connected, the usable time calculation unit calculates the usable time of the battery device using the average power level and a current integration value which is an integration value of current flowing during charging and discharging of the battery device.

The component may be an interchangeable lens.

A display unit which displays information may further included, and the display unit may display the usable time of the battery device.

The usable time calculation unit may receive the current integration value from the battery device.

The usable time calculation unit may receive information of a current value of the current flowing during charging and discharging of the battery device from the battery device and calculate the current integration value.

When the component is performed at other operation mode which is one of a plurality of operation modes and different from the predetermined operation mode, the usable time calculation unit may calculate the average power level at the other operation mode, using the average power level obtained at the predetermined operation mode.

When the component is performed at a plurality of operation modes, the usable time calculation unit may calculate the average power level using an average power level obtained at each of the operation modes and an operation time ratio of each of the operation modes.

The usable time calculation unit may store the measured average power level and when a difference between an average power level obtained by measurement thereafter and the stored average power level is equal to or greater than a predetermined value, the usable time calculation unit may determine that the component is exchanged with other component.

According to another embodiment of the disclosure, there is provided a method of calculating usable time of an imaging apparatus including: calculating a usable time of a battery device having a secondary battery, wherein an average power level is measured while a component is performed at a predetermined operation mode, wherein the power consumption of the component is unknown in advance before power is supplied after the component is initially connected, and when power is supplied for the second and subsequent times while the component is continuously connected, the usable time of the battery device is calculated using the average power level and a current integration value which is an integration value of current flowing during charging and discharging of the battery device.

As described above, according to the embodiments of the disclosure, a new or improved imaging apparatus and a method of calculating a usable time of an imaging apparatus, capable of calculating a usable time of a battery even when a device of which power consumption is unknown in advance is connected, can be provided.

BRIEF DESCRIPTION OF THE DRAWINGS

FIG. 6 is a diagram illustrating an example of contents of communication data transmitted between the interchangeable-lens system camera body and the battery pack;

FIG. 9 is a diagram illustrating a relationship between power consumption of the interchangeable-lens system camera and a display of a battery usable time of the battery pack as a timing chart;

FIG. 10 is a diagram illustrating an example of a power consumption table of the interchangeable-lens system camera according to the embodiment of the disclosure;

FIG. 11 is a diagram showing an example of a power consumption table of the interchangeable-lens system camera according to the embodiment of the disclosure;

FIG. 12 is a diagram illustrating an example of usable time ratios during standby, during auto focus processing, and during auto exposure processing when video shooting is performed;

FIG. 13 is a diagram illustrating an example of usable time ratios during standby, during auto focus processing, and during auto exposure processing when still image shooting is performed.

DETAILED DESCRIPTION OF EMBODIMENTS

Figure 1:
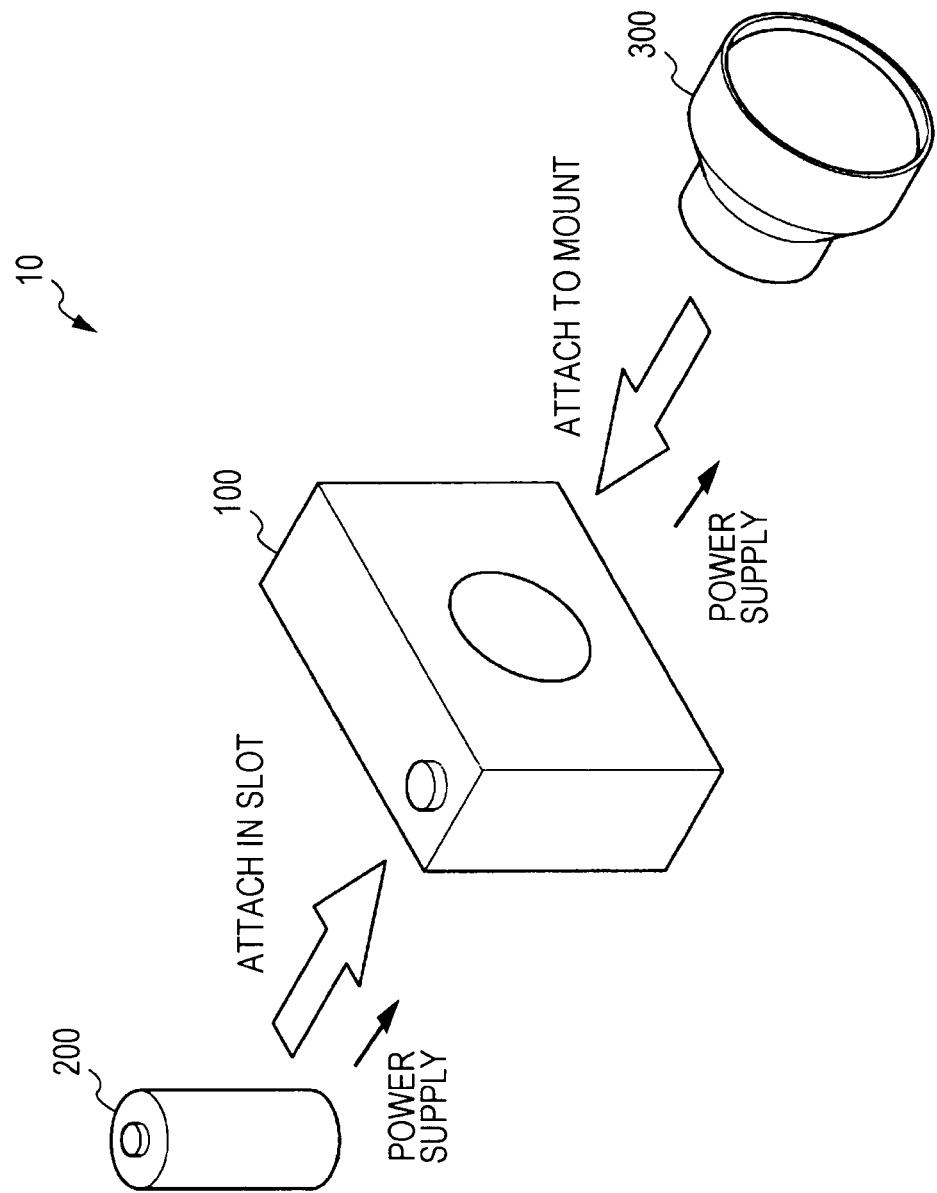
FIG. 1 is a diagram illustrating an example of the configuration of an interchangeable-lens system camera according to an embodiment of the disclosure.

Exemplary embodiments of the disclosure will now be described in detail with reference to the accompanying drawings. In addition, in the specification and drawings, like elements having substantially the same functional configurations are denoted by like reference numerals, and overlapping description thereof will be omitted.

The description will be provided in the following order.
1. Embodiment of Disclosure
1-1. Example of Appearance of Interchangeable-Lens System Camera
1-2. Example of information Displayed on Interchangeable-Lens System Camera Body
1-3. Functional Configuration of Each Device of Interchangeable-Lens System Camera
1-4. Configuration for Performing Communication Process
1-5. Operations of Interchangeable-Lens System Camera
2. Conclusions

1. EMBODIMENT OF DISCLOSURE

1-1. Example of Configuration of Interchangeable-Lens System Camera

First, an example of the configuration of an interchangeable-lens system camera according to an embodiment of the disclosure will be described. FIG. 1 is a diagram illustrating an example of the configuration of an interchangeable-lens system camera 10 according to the embodiment of the disclosure. Hereinafter, the example of the configuration of the interchangeable-lens system camera 10 according to the embodiment of the disclosure will be described using FIG. 1.

As shown in FIG. 1, the interchangeable-lens system camera 10 according to the embodiment of the disclosure includes an interchangeable-lens system camera body 100, a battery pack 200, and an interchangeable lens 300.

The interchangeable-lens system camera body 100 is an example of an electronic device of the disclosure and is used in a state where the battery pack 200 having a secondary battery such as a lithium-ion battery therein is inserted and the interchangeable lens 300 is attached. The interchangeable-lens system camera body 100 is operated by being supplied with power from the inserted battery pack 200, and the interchangeable lens 300 is operated by being supplied with power from the interchangeable-lens system camera body 100 supplied with power from the battery pack 200.

The example of the configuration of the interchangeable-lens system camera 10 according to the embodiment of the disclosure has been described using FIG. 1. Next, an example of information displayed on the interchangeable-lens system camera body 100 of the interchangeable-lens system camera 10 according to the embodiment of the disclosure will be described.

Figure 2:
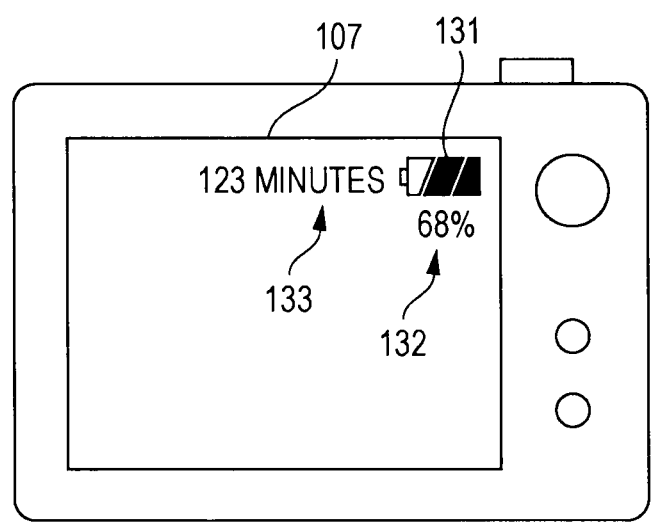
FIG. 2 is a diagram illustrating an example of information displayed on an interchangeable-lens system camera body.

1-2. Example of Information Displayed on Interchangeable-Lens System Camera Body FIG. 2 is a diagram illustrating an example of information displayed on the interchangeable-lens system camera body 100 of the interchangeable-lens system camera 10 according to the embodiment of the disclosure. Hereinafter, the example of information displayed on the interchangeable-lens system camera body 100 will be described using FIG. 2.

FIG. 2 illustrates a state where information regarding the remaining capacity of the battery pack 200 is displayed on a liquid crystal panel 107 of the interchangeable-lens system camera body 100. Illustrated in FIG. 2 are an empty cell display 131, a percentage display 132, and a minutes display 133 displayed as the information regarding the remaining capacity of the battery pack 200 on the liquid crystal panel 107 of the interchangeable-lens system camera body 100.

The empty cell display 131 displays "full" (displays all the cells) when the battery pack 200 is in a fully charged state, and displays "empty" (displays no cells) when the battery pack 200 has no remaining capacity. In a state between the fully charged state and the state of no remaining capacity of the battery pack 200, the empty cell display 131 changes the number of displayed cells according to the capacity.

The percentage display 132 displays 100% when the battery pack 200 is in the fully charged state, displays 0% when the battery pack 200 has no remaining capacity, and displays a state therebetween in increments of 1% according to the remaining capacity of the battery pack 200.

The minutes display 133 displays a remaining usable time of the interchangeable-lens system camera 10 in units of minutes.

The example of the information displayed on the interchangeable-lens system camera body 100 has been described using FIG. 2. Next, the functional configuration of each of the devices constituting the interchangeable-lens system camera 10 according to the embodiment of the disclosure will be described.

Figure 3:
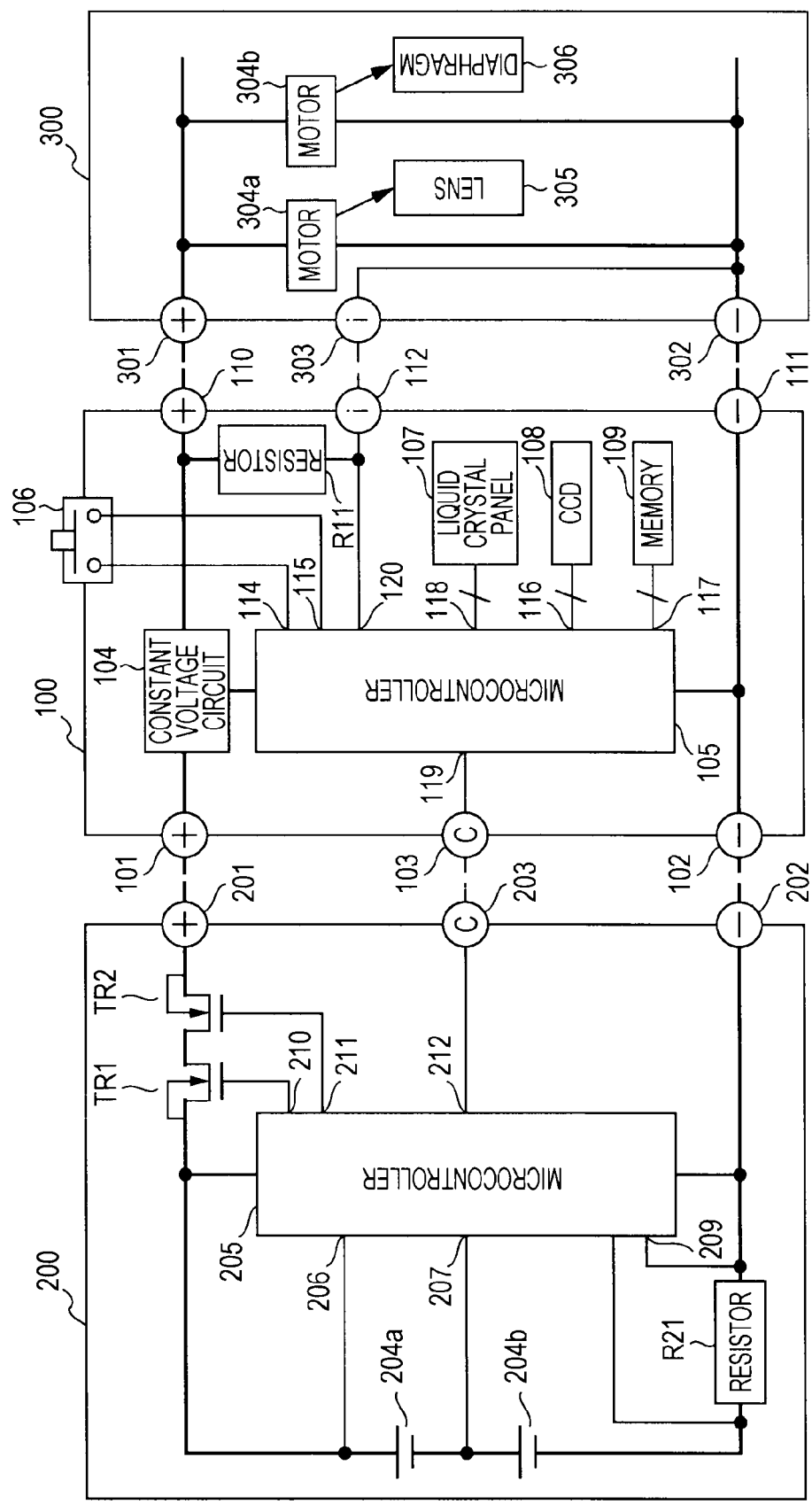
FIG. 3 is a diagram illustrating the functional configuration of each of the devices constituting the interchangeable-lens system camera according to the embodiment of the disclosure.

1-3. Functional Configuration of Each Device of Interchangeable-Lens System Camera FIG. 3 is a diagram illustrating the functional configuration of each of the devices constituting the interchangeable-lens system camera 10 according to the embodiment of the disclosure. Hereinafter, the functional configuration of each of the devices constituting the interchangeable-lens system camera 10 according to the embodiment of the disclosure will be described using FIG. 3.

As shown in FIG. 3, the interchangeable-lens system camera body 100 includes a + terminal 101, a − terminal 102, a C terminal 103, a constant voltage circuit 104, a microcontroller 105, a shutter button 106, a liquid crystal panel 107, a CCD image sensor 108, a memory 109, a + terminal 110, a − terminal 111, an i terminal 112, and a pull-up resistor R11.

In addition, as shown in FIG. 3, the battery pack 200 includes a + terminal 201, a − terminal 202, a C terminal 203, cells 204a and 204b, a charging protection FET TR1, a discharging protection FET TR2, a current detection resistor R21, and a microcontroller 205.

In addition, as shown in FIG. 3, the interchangeable lens 300 includes a + terminal 301, a − terminal 302, an i terminal 303, motors 304a and 304b, a lens 305, and a diaphragm 306.

The + terminal 101 and the − terminal 102 are terminals connected to the + terminal 201 and the − terminal 202 of the battery pack 200. As the battery pack 200 is attached to the interchangeable-lens system camera body 100 and the + terminal 101 and the − terminal 102 are connected to the + terminal 201 and the − terminal 202, power is supplied from the battery pack 200 or power is supplied to the battery pack 200.

The C terminal 103 is a terminal connected to the C terminal 203 of the battery pack 200. As the C terminal 103 of the interchangeable-lens system camera body 100 and the C terminal 203 of the battery pack 200 are connected to each other, the interchangeable-lens system camera body 100 can communicate with the battery back 200.

The constant voltage circuit 104 supplies power supplied from the battery pack 200 or an external power supply to the microcontroller 105 as a constant voltage. In addition, the constant voltage circuit 104 also has a function of supplying power supplied from the battery pack 200 to the interchangeable lens 300 as a constant voltage.

The microcontroller 105 is operated by being supplied with power from the constant voltage circuit 104 and controls the operations of the interchangeable-lens system camera body 100, the battery pack 200, and the interchangeable lens 300.

The microcontroller 105 has input-output ports 114, 115, 119 and an input port 120 and is connected to buses 116, 117, and 118.

The shutter button 106 is a button for shooting an image, and when the shutter button 106 is pressed by a user, the microcontroller 105 can detect the press of the shutter button 106 by the input-output ports 114 and 115. The microcontroller 105 performs a predetermined imaging operation by detecting the press of the shutter button 106.

The shot image and various kinds of information are displayed on the liquid display panel 107. For example, when the microcontroller 105 detects that the shutter button 106 is pressed using the input-output ports 114 and 115, the microcontroller 105 acquires data of the CCD image sensor 108 via the buses 116 and records the acquired data on the memory 109 via the bus 117. Thereafter, the microcontroller 105 reads the shot data from the memory 109 via the bus 117 and causes the data to be displayed on the liquid crystal panel 107 via the bus 118.

In addition, for example, when the microcontroller 105 acquires the voltage, current, and current integration value of the battery pack 200 through the input-output ports 119 by communicating with the battery pack 200 through the C terminal 103, the microcontroller 105 calculates the remaining battery level of the battery pack 200 and causes the calculated level to be displayed on the liquid crystal panel 107.

The CCD image sensor 108 obtains image data of an imaged object, and the CCD image sensor 108 supplies the image data to the microcontroller 105. The microcontroller 105 records the image data supplied from the CCD image sensor 108 on the memory 109 or causes the image data to be displayed on the liquid crystal panel 107.

The memory 109 is a recording medium on which the image data of the imaged object is recorded. The image data recorded on the memory 109 is displayed on the liquid crystal panel 107 on the basis of user operations.

The + terminal 110 and the − terminal 111 are terminals respectively connected to the + terminal 301 and the − terminal 302 of the interchangeable lens 300. The i terminal 112 is a terminal connected to the i terminal 302 of the interchangeable lens 300.

When the interchangeable lens 300 is attached to the interchangeable-lens system camera body 100, the + and − terminals 110 and 111 of the interchangeable-lens system camera body 100 are connected to the + and − terminals 301 and 302 of the interchangeable lens 300 are connected, and power is supplied to the interchangeable lens 300 from the interchangeable-lens system camera body 100.

At the same time, when the interchangeable lens 300 is attached to the interchangeable-lens system camera body 100, the i terminal 112 of the interchangeable-lens system camera body 100 is connected to the i terminal 303 of the interchangeable lens 300. As the i terminal 112 of the interchangeable-lens system camera body 100 is connected to the i terminal 303 of the interchangeable lens 300, the interchangeable-lens system camera body 100 can detect attachment of the interchangeable lens 300.

When the interchangeable lens 300 is not attached to the interchangeable-lens system camera body 100, the input port 120 of the microcontroller 105 comes to have a High level by the pull-up resistor R11.

Since the i terminal 303 of the interchangeable lens 300 is connected to the − terminal 302, when the interchangeable lens 300 is attached to the interchangeable-lens system camera body 100, the i terminal 112 of the interchangeable-lens system camera body 100 is connected to the i terminal 303 of the interchangeable lens 300, and thus the input port 120 of the microcontroller 105 comes to have a Low level.

Therefore, the microcontroller 105 can determine that the interchangeable lens 300 is not attached if the input port 120 has the High level, and determine that the interchangeable lens 300 is attached if the input port 120 has the Low level.

The + terminal 201 and the − terminal 202 are terminals connected to the + terminal 101 and the − terminal 102 of the interchangeable-lens system camera body 100. As the battery pack 200 is attached to the interchangeable-lens system camera body 100 and the + and − terminals 101 and 102 are connected to the + and − terminals 201 and 202, the battery pack 200 supplies power to the interchangeable-lens system camera body 100 or receives power from the interchangeable-lens system camera body 100.

The C terminal 203 is a terminal connected to the C terminal 103 of the interchangeable-lens system camera body 100. As the C terminal 103 of the interchangeable-lens system camera body 100 is connected to the C terminal 203 of the battery pack 200, the battery pack 200 can communicate with the interchangeable-lens system camera body 100.

The cells 204a and 204b accumulate power to be supplied to the interchangeable-lens system camera body 100. The power accumulated in the cells 204a and 204b is supplied to the interchangeable-lens system camera body 100 as the battery pack 200 is attached to the interchangeable-lens system camera body 100 and the + and − terminals 101 and 102 are connected to the + and − terminals 201 and 202.

In addition, in this embodiment, a configuration in which two cells are connected in series is illustrated. However, it can be said that a connection form of the cells is not limited to the example.

The microcontroller 205 measures voltages of the cells 204a and 204b or current flowing through the cells 204a and 204b, or transmits information regarding the cells 204a and 204b to the interchangeable-lens system camera body 100. The microcontroller 205 is operated by power supplied from the cells 204a and 204b during discharging of the battery pack 200 and by power supplied from the + and − terminals 201 and 202 during charging of the battery pack 200.

The microcontroller 205 has AD ports 206 and 207 and thus can measure the voltages of the cells 204a and 204b. The microcontroller 205 has AD ports 208 and 209 and thus can measure voltages at both ends of the current detection resistor R21. The microcontroller 205 stores the resistance value of the current detection resistor R21 in an embedded memory (not shown) as an existing value, and thus can calculate current discharged from the battery pack 200 or charged by the battery pack 200 by dividing the voltage value by the resistance value.

When the voltage and current measured by the above-described method are abnormal, the microcontroller 205 turns off the charging protection FET TR1 using the output port 210 or the discharging protection FET TR2 using the output port 211, thereby protecting the cells 204a and 204b and the interchangeable-lens system camera body 100 connected to the battery pack 200.

In addition, the microcontroller 205 stores 100% capacity of the battery pack 200 in a new product state in a memory (not shown). The microcontroller 205 calculates the sum of the current integration value currently collected in the cells 204a and 204b by integrating the current measured by the above-described method every predetermined time and stores the calculated sum in a memory (not shown).

The microcontroller 205 calculates the sum of the current integration value of the current currently charged in the cells 204a and 204b by integrating the current measured by the above-described method every predetermined time only when current flows in a charging direction, calculates the number of charging and discharging times using (the number of charging and discharging times=charged current integration value/100% capacity in battery pack 200 in a new product state), and stores the calculated values in a memory (not shown).

The microcontroller 205 can output the 100% capacity in the battery pack 200 in a new product state, the number of charging and discharging times, and the current integration value obtained by the above-described method via the input-output port 212 through communication. The input-output port 212 is connected to the C terminal 203 and is configured to communicate with the outside of the battery pack 200 (the interchangeable-lens system camera body 100).

The + and − terminals 301 and 302 are terminals connected to the + and − terminals 110 and 111 of the interchangeable-lens system camera body 100. In addition, the i terminal 302 is a terminal connected to the i terminal 112 of the interchangeable-lens system camera body 100.

The motor 304a is a motor that drives the lens 305. In addition, the motor 304b is a motor that drives the diaphragm 306. As the motor 304a moves the lens 305, focusing and zooming are adjusted, and as the motor 304b moves the diaphragm 306, exposure is adjusted. The motors 304a and 304b are operated by power supplied from the + terminal 301 and the − terminal 302.

The functional configuration of each of the devices constituting the interchangeable-lens system camera 10 according to the embodiment of the disclosure has been described using FIG. 3. Next, a configuration for performing communication between the interchangeable-lens system camera body 100 and the battery pack 200 according to the embodiment of the disclosure will be described.

1-4. Configuration for Performing Communication Process

Figure 4:
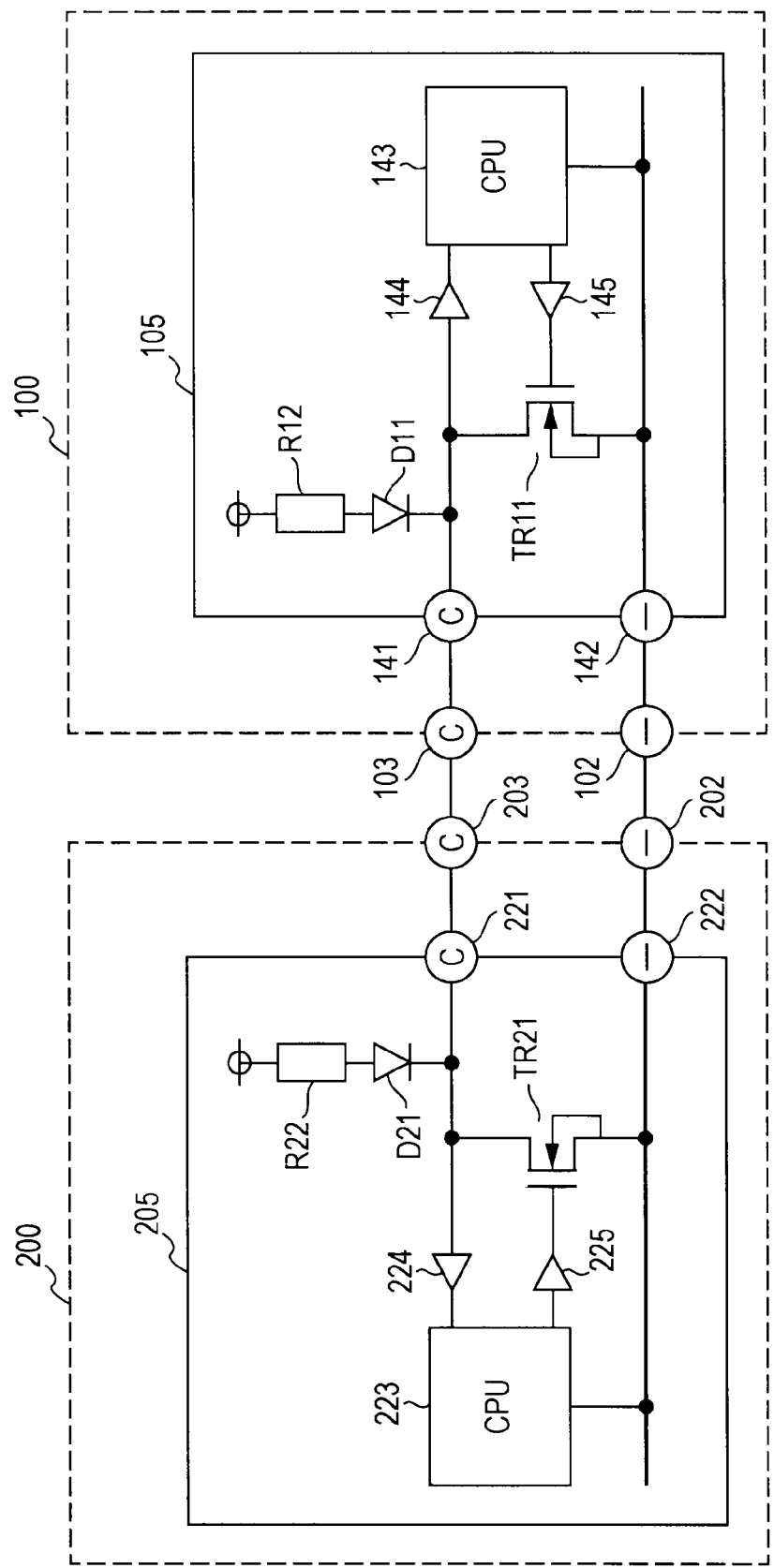
FIG. 4 is a diagram illustrating the configuration for performing a communication process between the interchangeable-lens system camera body and a battery pack according to the embodiment of the disclosure.

FIG. 4 is a diagram illustrating the configuration for performing a communication process between the interchangeable-lens system camera body 100 and the battery pack 200 according to the embodiment of the disclosure. Hereinafter, the configuration for performing a communication process between the interchangeable-lens system camera body 100 and the battery pack 200 according to the embodiment of the disclosure will be described using FIG. 4.

As shown in FIG. 4, the microcontroller 105 of the interchangeable-lens system camera body 100 includes an input-output port 141, a GND 142, a CPU 143, an input buffer 144, an output buffer 145, a pull-up resistor R12, an output FET TR11, and a pull-up diode D11.

On the other hand, as shown in FIG. 4, the microcontroller 205 of the battery pack 200 includes an input-output port 221, a GND 222, a CPU 223, an input buffer 224, an output buffer 225, a pull-up resistor R22, an output FET TR21, and a pull-up diode D21.

The GND 222 of the microcontroller 205 of the battery pack 200 is connected to the GND 142 of the microcontroller 105 of the interchangeable-lens system camera body 100 via the − terminal 202 of the battery pack 200 and the − terminal 102 of the interchangeable-lens system camera body 100.

The input-output port 221 of the microcontroller 205 of the battery pack 200 is connected to the input-output port 141 of the microcontroller 105 of the interchangeable-lens system camera body 100 via the C terminal 203 of the battery pack 200 and the C terminal 103 of the interchangeable-lens system camera body 100.

When the microcontroller 205 of the battery pack 200 is to output a Low level to the C terminal 203 of the battery pack 200, the microcontroller 205 outputs a High level to the output buffer 225. Then, the output FET TR21 is turned on, the input-output port 221 comes to have the Low level, and the C terminal 203 comes to have the Low level.

On the other hand, when the microcontroller 205 of the battery pack 200 is to output a High level to the C terminal 203 of the battery pack 200, the microcontroller 205 outputs a Low level to the output buffer 225. Then, the output FET TR21 is turned off, the input-output port 221 comes to have the High level by the pull-up resistor R22 and the pull-up diode D21, and the C terminal 203 comes to have the High level.

When the microcontroller 205 of the battery pack 200 is to confirm whether the C terminal 203 of the battery pack 200 has the High level or the Low level, the microcontroller 205 can make confirmation via the input buffer 224.

When the microcontroller 105 of the interchangeable-lens system camera body 100 is to output a Low level to the C terminal 103 of the interchangeable-lens system camera body 100, the microcontroller 105 outputs a High level to the output buffer 145. Then, the output FET TR11 is turned on, the input-output port 141 comes to have the Low level, and the C terminal 103 comes to have the Low level.

On the other hand, when the microcontroller 105 of the interchangeable-lens system camera body 100 is to output a High level to the C terminal 103 of the interchangeable-lens system camera body 100, the microcontroller 105 outputs a Low level to the output buffer 145. Then, the output FET TR11 is turned off, the input-output port 141 comes to have the High level by the pull-up resistor R12 and the pull-up diode D11, and the C terminal 103 comes to have the High level.

When the microcontroller 105 of the interchangeable-lens system camera body 100 is to confirm whether the C terminal 103 of the interchangeable-lens system camera body 100 has the High level or the Low level, the microcontroller 105 can make confirmation via the input buffer 144.

Figure 5:
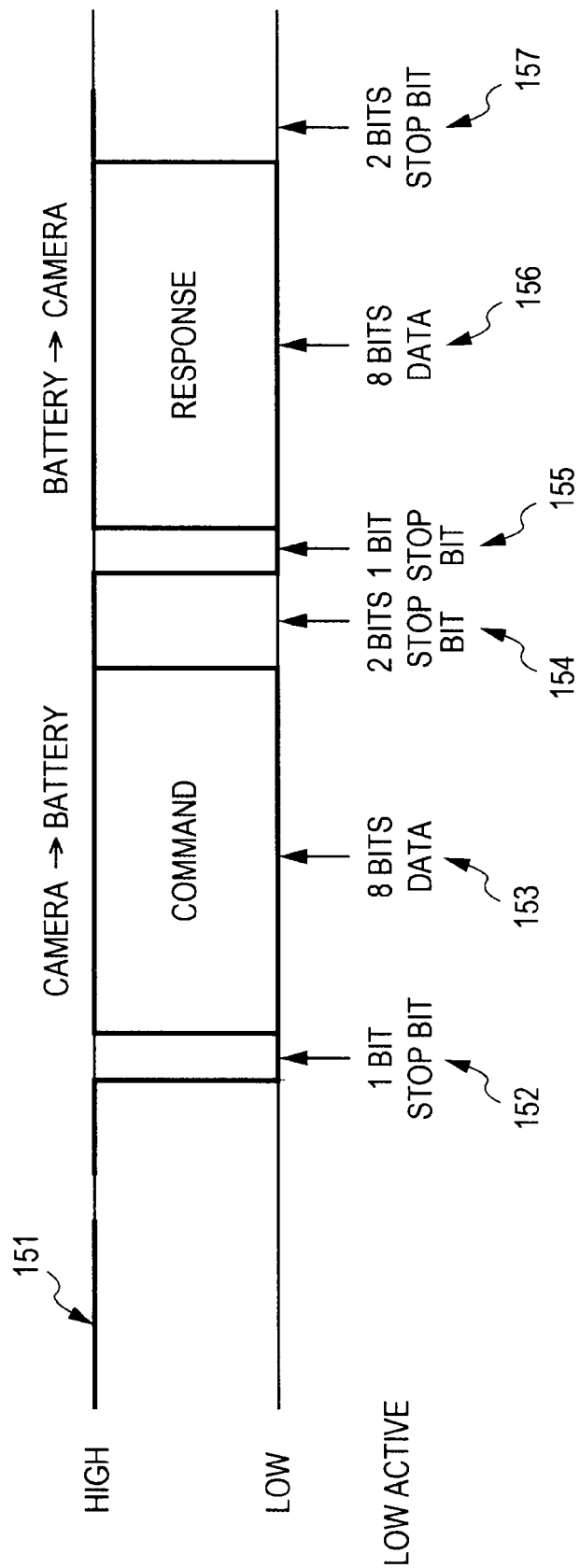
FIG. 5 is a diagram illustrating a communication timing chart between the interchangeable-lens system camera body and the battery pack.

FIG. 5 is a diagram illustrating a communication timing chart of communication between the interchangeable-lens system camera body 100 and the battery pack 200.

Before the interchangeable-lens system camera body 100 and the battery pack 200 communicate with each other, both the output FET TR21 of the battery pack 200 and the output FET TR11 of the interchangeable-lens system camera body 100 are turned off, and a communication line comes to have a High level (reference numeral 151).

At the start of communication, the microcontroller 105 of the interchangeable-lens system camera body 100 turns on the output FET TR11 for a time corresponding to 1 bit of communication data and causes the communication line to have a Low level (reference numeral 152). The microcontroller 105 of the interchangeable-lens system camera body 100 and the microcontroller 205 of the battery pack 200 acquire synchronization of communication timing on the basis of the Low section corresponding to 1 bit of communication data.

Next, the microcontroller 105 of the interchangeable-lens system camera body 100 transmits command 8 bits (reference numeral 153). The microcontroller 105 of the interchangeable-lens system camera body 100 turns off the output FET TR11 at a bit with the High output and turns on the output FET TR12 at a bit with the Low output.

The microcontroller 205 of the battery pack 200 receives High and Low outputs sent from the microcontroller 105 of the interchangeable-lens system camera body 100 via the input buffer 224.

Next, the microcontroller 105 of the interchangeable-lens system camera body 100 transmits 2 stop bits (reference numeral 154). The microcontroller 205 of the battery pack 200 confirms the end of communication using the 2 stop bits.

Next, the microcontroller 105 of the interchangeable-lens system camera body 100 turns on the output FET TR11 again for a time corresponding to 1 bit of the communication data, and causes the communication line to have the Low level (reference numeral 155).

Next, the microcontroller 205 of the battery pack 200 transmits 8 response bits (reference numeral 156). The microcontroller 205 of the battery pack 200 turns off the output FET TR21 at a bit with the High output and turns on the output FET TR21 at a bit with the Low output.

The microcontroller 105 of the interchangeable-lens system camera body 100 receives the High and Low outputs via the input buffer 144.

Next, the microcontroller 105 of the interchangeable-lens system camera body 100 transmits 2 stop bits (reference numeral 157). The microcontroller 205 of the battery pack 200 confirms the end of communication using the 2 stop bits.

Communication between the interchangeable-lens system camera body 100 and the battery pack 200 is completed one time by the flow of a series of processes.

FIG. 6 is a diagram illustrating an example of contents of the communication data transmitted between the interchangeable-lens system camera body 100 and the battery pack 200.

When the microcontroller 105 of the interchangeable-lens system camera body 100 transmits "0x01" (reference numeral 181) as the command (reference numeral 153), the microcontroller 205 of the battery pack 200 transmits a current value (reference numeral 182) as the response (reference numeral 156).

When the microcontroller 105 of the interchangeable-lens system camera body 100 transmits "0x02" (reference numeral 183) as the command (reference numeral 153), the microcontroller 205 of the battery pack 200 transmits a voltage value (reference numeral 184) as the response (reference numeral 156).

When the microcontroller 105 of the interchangeable-lens system camera body 100 transmits "0x03" (reference numeral 183) as the command (reference numeral 153), the microcontroller 205 of the battery pack 200 transmits a current integration value (reference numeral 186) as the response (reference numeral 156).

Of course, the command and response shown in FIG. 6 are examples and are not limited to the examples according to the disclosure. It can be said that the number of bits of data shown in FIG. 5 is not limited to the examples according to the disclosure.

The configuration for performing a communication process between the interchangeable-lens system camera body 100 and the battery pack 200 according to the embodiment of the disclosure has been described. Next, operations of the interchangeable-lens system camera 10 according to the embodiment of the disclosure will be described.

1-5. Operations of Interchangeable-Lens System Camera

Figure 7:
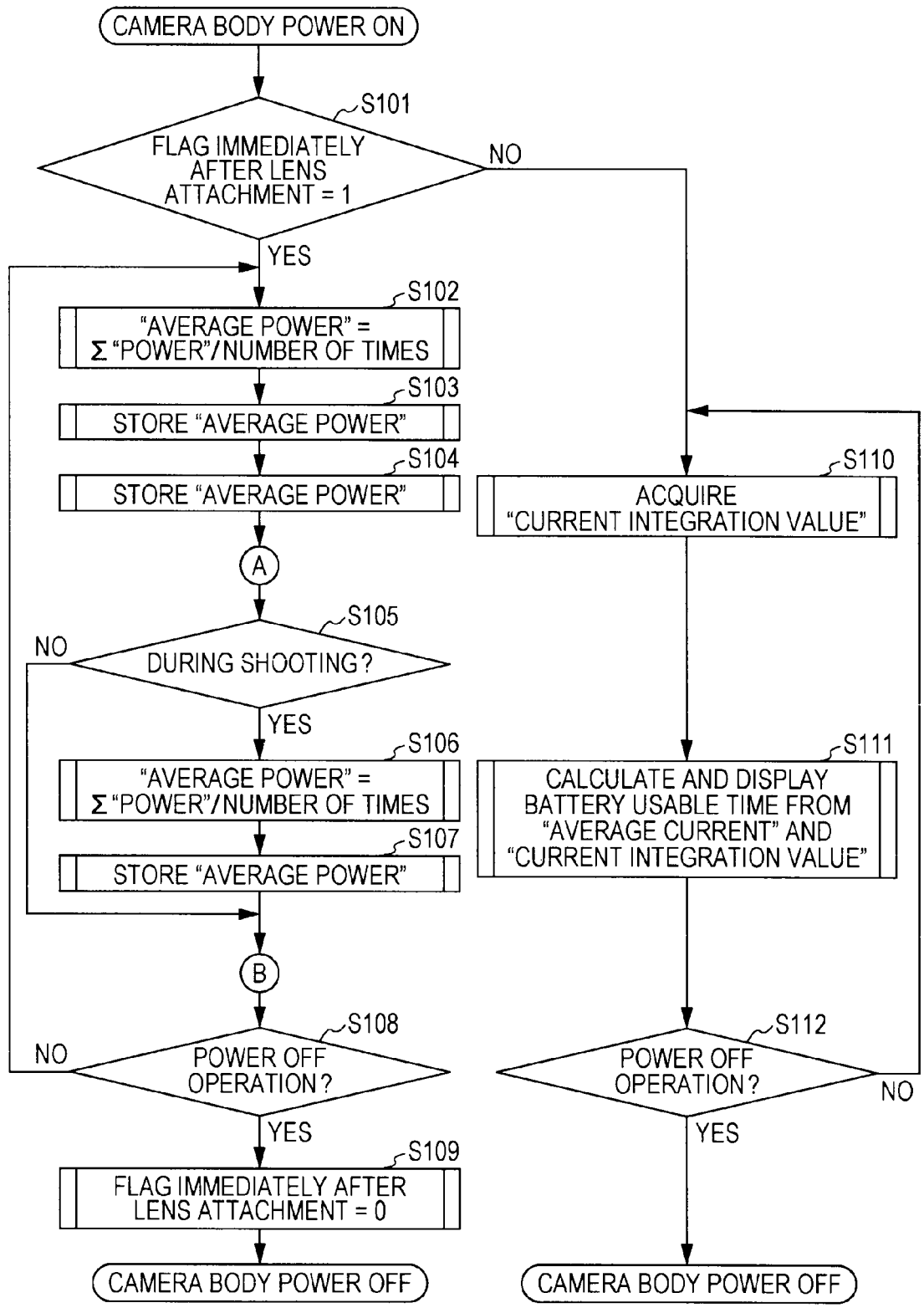
FIG. 7 is a flowchart showing operations of the interchangeable-lens system camera according to the embodiment of the disclosure.
Figure 8:
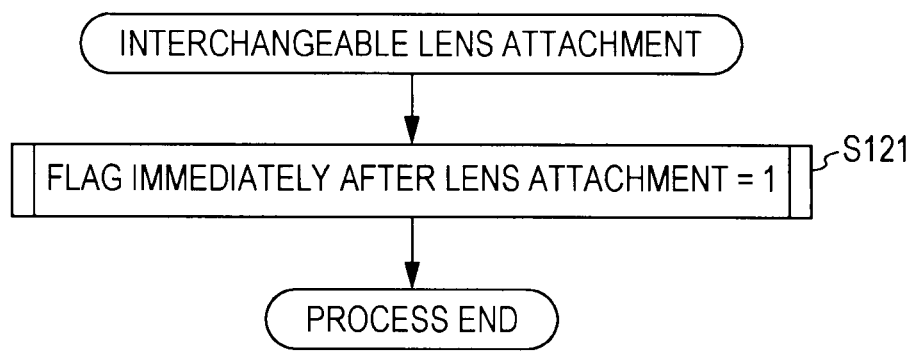
FIG. 8 is a flowchart showing operations of the interchangeable-lens system camera according to the embodiment of the disclosure.

FIGS. 7 and 8 are flowcharts illustrating operations of the interchangeable-lens system camera 10 according to the embodiment of the disclosure. Hereinafter, the operations of the interchangeable-lens system camera 10 according to the embodiment of the disclosure will be described using FIGS. 7 and 8.

When the interchangeable-lens system camera body 100 of the interchangeable-lens system camera 10 is powered on by the user of the interchangeable-lens system camera 10, the microcontroller 105 of the interchangeable-lens system camera body 100 performs a process of displaying a usable time of the battery pack 200.

The microcontroller 105 of the interchangeable-lens system camera body 100 determines whether or not a flag immediately after lens attachment is 1 when the interchangeable-lens system camera body 100 is powered on (Step S101). The flag immediately after lens attachment is a flag recorded on the microcontroller 105 and is a flag representing that it is immediately after the interchangeable lens 300 is attached to the interchangeable-lens system camera body 100 (first power-on after lens interchange). In addition, the interchangeable lens 300 is a device of which power consumption is not known in advance by the interchangeable-lens system camera lens 100.

As the determination result of Step S101, if the flag immediately after lens attachment is 1, the microcontroller 105 of the interchangeable-lens system camera body 100 acquires the value of the voltage of the battery pack 200 by communicating with the microcontroller 205 of the battery pack 200 (Step S102) and acquires the value of current flowing through the battery pack 200 (Step S103).

In Steps S102 and S103, the microcontroller 105 which acquires the value of the voltage of the battery pack 200 and the value of the current flowing through the battery pack 200 calculates a power value of the battery pack 200 by multiplying the values (Step S104). The microcontroller 105 internally stores the calculated power value.

When the power value of the battery pack 200 is calculated in Step S104, subsequently, the microcontroller 105 determines whether or not the interchangeable-lens system camera 10 performs a shooting process (Step S105).

As the determination result of Step S105, if the interchangeable-lens system camera 10 is performing the shooting process, the microcontroller 105 calculates an average power level by dividing the sum of the power value calculated in Step S104 by the number of times at which it is determined that the interchangeable-lens system camera 10 is performing the shooting process in Step S105 (Step S106). When the microcontroller 105 calculates the average power level in Step S106, the microcontroller 105 internally stores the value of the average power level (Step S107).

On the other hand, as the determination result of Step S105, if the interchangeable-lens system camera 10 is not performing the shooting process, the processes of Steps S106 and S107 are skipped.

Subsequently, the microcontroller 105 determines whether or not the interchangeable-lens system camera body 100 of the interchangeable-lens system camera 10 is powered off by the user of the interchangeable-lens system camera 10 (Step S108).

As the determination result of Step S108, if it is determined that the interchangeable-lens system camera body 100 of the interchangeable-lens system camera 10 is powered off by the user of the interchangeable-lens system camera 10, the microcontroller 105 updates the flag immediately after lens attachment to 0 (Step S109) and powers off the interchangeable-lens system camera body 100. On the other hand, as the determination result of Step S108, if the microcontroller 105 determines that the interchangeable-lens system camera body 100 of the interchangeable-lens system camera 10 is not powered off by the user of the interchangeable-lens system camera 10, the process is returned to Step S102.

As the determination result of Step S101, if the flag immediately after lens attachment is not 1 (is 0), the microcontroller 105 of the interchangeable-lens system camera body 100 acquires the current integration value of the battery pack 200 by communicating with the microcontroller 205 of the battery pack 200 (Step S110).

When the microcontroller 105 acquires the current integration value of the battery pack 200 in Step S110, subsequently, the microcontroller 105 calculates the battery usable time of the battery pack 200 from the average power level calculated in Step S106 and the current integration value acquired in Step S110 and causes the calculated battery usable time to be displayed on the liquid crystal panel 107 (Step S111).

Here, the microcontroller 105 calculates the battery usable time by $$(A/B) \times (D/C)$$

where
A: "current integration value (unit: Ah)"
B: "current integration value when fully charged (unit: Ah)"
C: "average power level (unit: W)" 89
D: "usable time when a fully charged battery is used at 1 W (unit: W·min)"

and B and D are used by storing fixed values in the microcontroller 105 in advance.

In Step S111, when the microcontroller 105 causes the battery usable time of the battery pack 200 to be displayed on the liquid crystal panel 107, subsequently, the microcontroller 105 determines whether the interchangeable-lens system camera body 100 of the interchangeable-lens system camera 10 is powered on or off by the user of the interchangeable-lens system camera 10 (Step S112).

As the determination result of Step S112, if it is determined that the interchangeable-lens system camera body 100 of the interchangeable-lens system camera 10 is powered off by the user of the interchangeable-lens system camera 10, the microcontroller 105 powers off the interchangeable-lens system camera body 100. On the other hand, as the determination result of Step S112, if the microcontroller 105 determines that the interchangeable-lens system camera body 100 of the interchangeable-lens system camera 10 is not powered off by the user of the interchangeable-lens system camera 10, the process is returned to Step S110.

The flag immediately after lens attachment is set to 1 at a time point of attachment of the interchangeable lens 300 to the interchangeable-lens system camera body 100. FIG. 8 is a flowchart showing a process performed when the interchangeable lens 300 is attached to the interchangeable-lens system camera body 100.

When the microcontroller 105 detects that the interchangeable lens 300 is attached to the interchangeable-lens system camera body 100, the microcontroller 105 sets the flag immediately after lens attachment to 1 (Step S121). Accordingly, the microcontroller 105 can recognize that it is immediately after the interchangeable lens 300 is attached to the interchangeable-lens system camera body 100.

FIG. 9 is a diagram illustrating a relationship between power consumption of the interchangeable-lens system camera 10 and a display of the battery usable time of the battery pack 200 as a timing chart.

When the interchangeable-lens system camera body 100 is powered on for the first time after lens interchange, power of the battery pack 200 starts to be consumed. Power before the start of shooting is not used for the calculation of the average power level in Step S106. On the other hand, power after the start of shooting is used for the calculation of the average power level in Step S106.

In addition, the power after the end of shooting is not used for the calculation of the average power level in Step S106. Displaying of the battery usable time (minutes) of the liquid crystal panel 107 between power-on of the interchangeable-lens system camera body 100 for the first time after lens interchange and power-off is not performed.

Thereafter, when the interchangeable-lens system camera body 100 is powered on for the second and subsequent times after lens interchange, using the average power level calculated from power-on of the camera body for the first time after lens interchange to power-off, displaying of the battery usable time (minutes) on the liquid crystal panel 107 is immediately performed by the microcontroller 105. The battery usable time (minutes) is calculated using the same average power level until power-off of the interchangeable-lens system camera body 100 for the second and subsequent times after lens interchange.

As such, as the information of the average power level calculated from power-on of the interchangeable-lens system camera body 100 to power-off for the first time after lens interchange is used, a more accurate battery usable time of the battery pack 200 attached to the interchangeable-lens system camera body 100 for the second and subsequent times after lens interchange can be calculated and displayed on the liquid crystal panel 107.

Next, another calculation example of the battery usable time will be described. As the interchangeable-lens system camera 10, there are one that can shoot only a still image, one that can shoot both a still image and a video, one that can select image quality during video shooting, one that can reproduce a shot video, and the like. In addition, the interchangeable-lens system camera 10 has different power consumption according to operations. In the following description, a case where the power consumption of the interchangeable-lens system camera 10 is obtained using a "power consumption table" in which information of power consumption which is different according to the operations of the interchangeable-lens system camera 10 is stored, and the battery usable time is calculated using the power consumption will be described.

FIG. 10 is a diagram illustrating an example of a power consumption table 400 of the interchangeable-lens system camera 10 according to the embodiment of the disclosure.

A camera body power consumption 401 of the power consumption table 400 shown in FIG. 10 records power consumption when the interchangeable lens 300 is not attached to the interchangeable-lens system camera body 100. The power consumption depends only on the interchangeable-lens system camera body 100 and thus can be known in advance during shipping of the interchangeable-lens system camera body 100. Therefore, the interchangeable-lens system camera body 100 is shipped in a state where the information of the camera body power consumption 401 is recorded in advance on the microcontroller 105.

When the user attaches the interchangeable lens 300 to the interchangeable-lens system camera body 100 and the interchangeable-lens system camera body 100 is powered on for the first time, power consumption at an operation mode at this time can be obtained by measurement. However, power consumption at other operation modes can be obtained by calculation from the measured values.

For example, in the example shown in FIG. 10, when the interchangeable lens 300 is attached to the interchangeable-lens system camera body 100 and the interchangeable-lens system camera body 100 is powered on for the first time, and video shooting (HD 1920) denoted by reference numeral 402 is performed, the measured value is used as the value of the power consumption 403 with the interchangeable lens included as it is.

Here, a difference (500 mW) between the power consumption 403 with the interchangeable lens included and the camera body power consumption 401 is the power consumption of the interchangeable lens 300. In addition, the power consumption of the interchangeable lens 300 is constant during shooting regardless of shooting modes, so that the power consumption 403 with the interchangeable lens included during video shooting (HD 1440), during video shooting (SD) or still image shooting can be obtained through calculation by adding the difference (500 mW) to the camera body power consumption 401.

In addition, during video reproduction (HD 1920, HD 1440, SD) and still image reproduction, power is not consumed by the interchangeable lens 300, so that the camera body power consumption 401 can be used as it is as the power consumption 403 with the interchangeable lens included.

When the user attaches the interchangeable lens 300 to the interchangeable-lens system camera body 100 and the interchangeable-lens system camera body 100 is powered on for the second and subsequent times, the microcontroller 105 can calculate the proper battery usable time with reference to the power consumption table 400 by using the power consumption 403 with the interchangeable lens included determined as such even when the interchangeable-lens system camera 10 is operated at any operation mode and cause the calculated battery usable time to be displayed on the liquid crystal panel 107.

When the battery usable time is calculated using the power consumption table 400 shown in FIG. 10, moreover, in consideration of a difference in power consumption during operations of the interchangeable lens 300 at each of the operation modes, a more accurate battery use time can be calculated.

FIG. 11 is a diagram showing an example of a power consumption table 500 of the interchangeable-lens system camera 10 according to the embodiment of the disclosure. The power consumption table 500 shown in FIG. 11 is recorded on the microcontroller 105.

The power consumption table 500 shown in FIG. 11 is a table in which differences in power consumption during standby in which the motors 304*a* and 304*b* of the interchangeable lens 300 are not moved, during shooting standby, during auto focus processing, and during auto exposure processing, and power consumption during execution of a corresponding process is obtained by adding the values shown in FIG. 11 to the power consumption values of the power consumption table 400 of FIG. 10.

A standard user has different usable time ratios during standby in which the motors 304*a* and 304*b* of the interchangeable lens 300 are not moved, during auto focus processing, and during auto exposure processing when video shooting is performed and when still image shooting is performed. FIG. 12 is a diagram illustrating an example of usable time ratios during standby, during auto focus processing, and during auto exposure processing when video shooting is performed, and FIG. 13 is a diagram illustrating an example of usable time ratios during standby, during auto focus processing, and during auto exposure processing when still image shooting is performed. Information of the usable time ratios is also recorded on the microcontroller 105.

In addition, by using the power consumption table 500 shown in FIG. 11 and the information of the usable time ratios during video shooting and during still image shooting shown in FIGS. 12 and 13, a more accurate battery usable time can be calculated and displayed on a screen.

Figure 14:
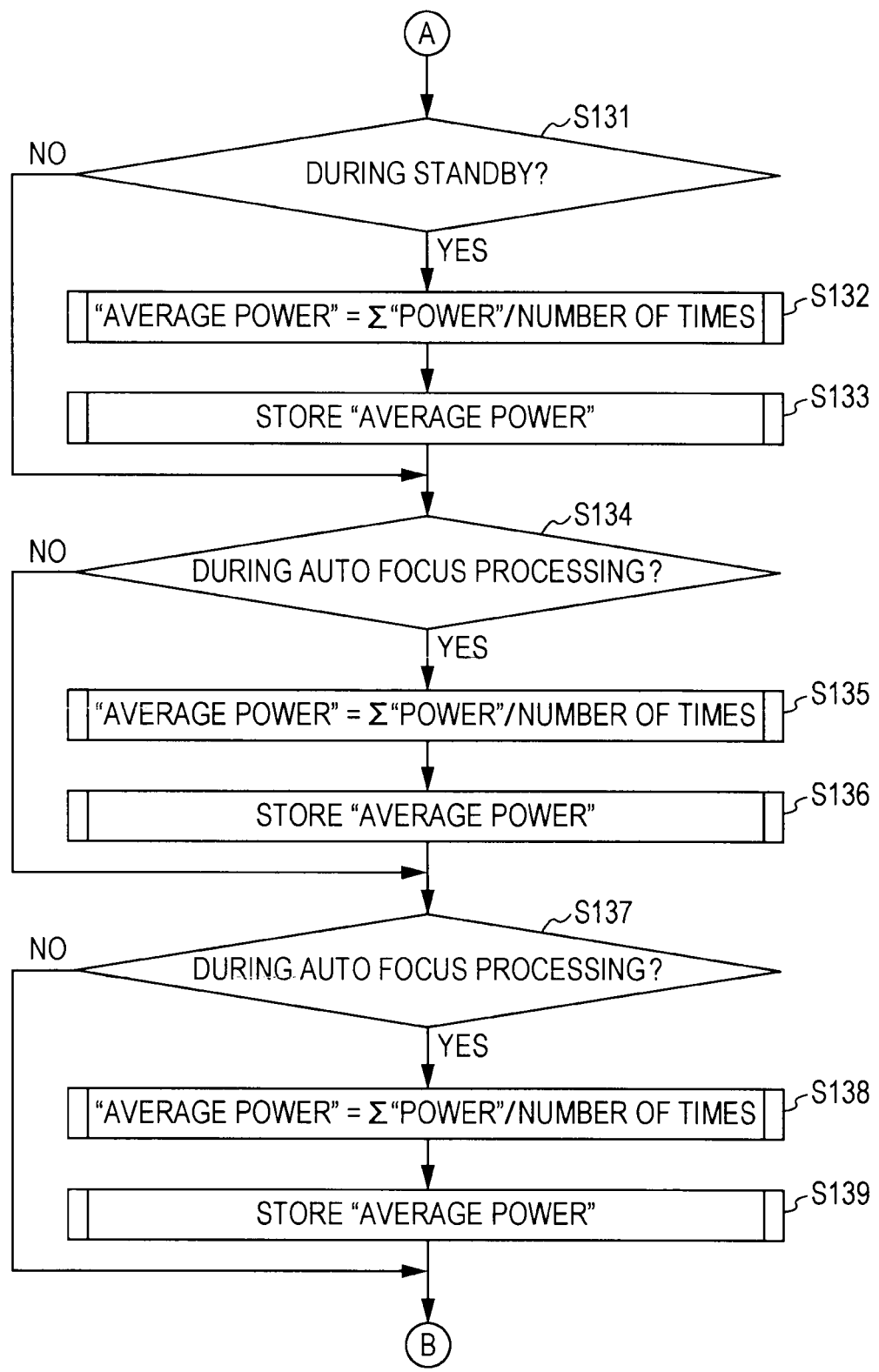
FIG. 14 is a flowchart showing operations of the interchangeable-lens system camera according to the embodiment of the disclosure.

FIG. 14 is a flowchart showing operations of the interchangeable-lens system camera 10 according to the embodiment of the disclosure. The flowchart shown in FIG. 14 is made by substituting the operations from Step S105 to Step S107 in the flowchart shown in FIG. 7, and other operations are not different from those of FIG. 7.

First, the microcontroller 105 determines whether or not the interchangeable-lens system camera 10 is in a standby state in which the motors 304a and 304b of the interchangeable lens 300 are not moved (Step S131).

As the determination result of Step S131, if the interchangeable-lens system camera 10 is in the standby state, the microcontroller 105 calculates an average power level by dividing the sum of power levels calculated in Step S104 by the number of times at which it is determined that the interchangeable-lens system camera 10 is in the standby state in Step S131 (Step S132). When the microcontroller 105 calculates the average power level in Step S132, the microcontroller 105 internally stores the value of the average power level (Step S133).

On the other hand, as the determination result of Step S131, if the interchangeable-lens system camera 10 is not performing the shooting process, the processes of Steps S132 and S133 are skipped.

Next, the microcontroller 105 determines whether or not the interchangeable-lens system camera 10 is in a state during auto focus processing (Step S134).

As the determination result of Step S134, if the interchangeable-lens system camera 10 is in a state during auto focus processing, the microcontroller 105 calculates the average power level by dividing the sum of the power levels calculated in Step S104 by the number of times at which it is determined that the interchangeable-lens system camera 10 is in the state during auto focus processing in Step S134 (Step S135). When the microcontroller 105 calculates the average power level in Step S135, the microcontroller 105 internally stores the value of the average power level (Step S136).

On the other hand, as the determination result of Step S134, if the interchangeable-lens system camera 10 is not performing the shooting process, the processes of Steps S135 and S136 are skipped.

Subsequently, the microcontroller 105 determines whether or not the interchangeable-lens system camera 10 is in a state during auto exposure processing (Step S137).

As the determination result of Step S134, if the interchangeable-lens system camera 10 is in a state during auto exposure processing, the microcontroller 105 calculates the average power level by dividing the sum of the power levels calculated in Step S104 by the number of times at which it is determined that the interchangeable-lens system camera 10 is in the state during auto exposure processing in Step S137 (Step S138). When the microcontroller 105 calculates the average power level in Step S138, the microcontroller 105 internally stores the value of the average power level (Step S139).

On the other hand, as the determination result of Step S137, if the interchangeable-lens system camera 10 is not performing the shooting process, the processes of Steps S138 and S139 are skipped.

By the flow of a series of processes, the average power level when the interchangeable-lens system camera 10 is in the state during standby, the average power level during autofocus processing, and the average power level during auto exposure processing are obtained. In addition, when the power consumption of the interchangeable-lens system camera body 100 (information indicated by reference numeral 401 of FIG. 10) is subtracted from the average power levels, differences between the average power level in the state during standby of the interchangeable-lens system camera 10, the average power level during auto focus processing, and the average power level during auto exposure processing are obtained.

The value made by subtracted the power consumption of the interchangeable-lens system camera body 100 from the power consumption with the interchangeable lens 300 included during video shooting can be obtained as follows.

$$A \times P1/100 + B \times P2/100 + C \times P3/100$$

(A: the difference of the average power level during standby

B: the difference of the average power level during auto focus

C: the difference of the average power level during auto exposure

P1: the usable time ratio during standby during video shooting

P2: the usable time ratio during auto focus during video shooting

P3: the usable time ratio during auto exposure during video shooting)

On the other hand, the value made by subtracting the power consumption of the interchangeable-lens system camera body 100 from the power consumption with the interchangeable lens 300 included during still image shooting can be obtained as follows.

$$A \times Q1/100 + B \times Q2/100 + C \times Q3/100$$

(A: the difference of the average power level during standby

B: the difference of the average power level during auto focus

C: the difference of the average power level during auto exposure

Q1: the usable time ratio during standby during still image shooting

Q2: the usable time ratio during auto focus during still image shooting

Q3: the usable time ratio during auto exposure during still image shooting)

As such, by obtaining the value made by subtracting the power consumption of the interchangeable-lens system camera body 100 from the power consumption with the interchangeable lens 300, the power consumption of the interchangeable lens 300 can be known, and a more accurate battery usable time can be calculated.

In addition, in the above-described example, by storing the usable time ratios during standby, during auto focus processing, and during auto exposure processing in the microcontroller 105, the power consumption of the interchangeable lens 300 is obtained. However, the disclosure is not limited to the example. That is, even though the usable time ratios are not stored in the microcontroller 105 in advance, by counting the number of times at which such processes are actually used and the number of times at which YES is determined in Steps S131, S134, and S137 in the processes shown in FIG. 14 described above, the ratio of the numbers of times may be used. In this case, a tendency of an individual user for a camera use method can be reflected in the calculation of the power consumption, so that a more accurate battery usable time can be calculated and displayed on a screen.

Determination of detachment and attachment of the interchangeable lens 300 may be performed by the i terminal 112 of the interchangeable-lens system camera body 100, and when a difference between an average power level calculated immediately before and the latest average power level is equal to or greater than a predetermined value, it may be determined that the interchangeable lens 300 attached to the interchangeable-lens system camera body 100 is interchanged. In this case, the latest average power level may be stored in the microcontroller 105 and the value may be used for calculation of the battery usable time thereafter.

In the above-described example, when the interchangeable-lens system camera body 100 is powered on initially after lens interchange, only calculation of an average power level is performed, and calculation and displaying of a battery usable time are not performed. However, when the interchangeable-lens system camera body 100 is powered on initially after lens interchange, calculation and displaying of a battery usable time may be performed using an average power level of an interchangeable lens which is packaged during shipping, an interchangeable lens which is recommended for use, or the like.

In addition, in the above-described example, when the interchangeable-lens system camera body 100 is powered on initially after lens interchange, only calculation of an average power level is performed, and calculation and displaying of a battery usable time are not performed. However, when the interchangeable-lens system camera body 100 is powered on initially after lens interchange, when sufficient data to calculate an average power level can be acquired and the average power level can be calculated, at this time point, calculation and displaying of a battery usable time may be performed using information of the average power level.

In addition, for example, the microcontroller 105 may calculate a battery usable time and compares the battery usable time with a recordable time of a recording medium embedded in the interchangeable-lens system camera body 100. When the recordable time of the recording medium is shorter, the microcontroller 105 may cause the liquid display panel 107 to display a predetermined warning.

2. CONCLUSIONS

As described above, according to the embodiment of the disclosure, when a device of which power consumption is unknown in advance, such as the interchangeable lens 300, is attached to the interchangeable-lens system camera body 100, a battery usable time which is not obtained according to the related art can be calculated and information of the time can be displayed.

The embodiment of the disclosure is not limited to a case where a system is formed of only a combination of devices of which power consumption is known in advance, and when a device of which power consumption is unknown in advance such as the interchangeable lens 300 is attached to the interchangeable-lens system camera body 100, a battery usable time which is not obtained according to the related art can be calculated and information of the time can be displayed.

According to the embodiment of the disclosure, when even the same device has different power consumption due to a use method of a user, a battery usable time which is not obtained according to the related art can be calculated and information of the time can be displayed.

According to the embodiment of the disclosure, only by measuring power consumption at an operation mode when a device of which power consumption is unknown in advance such as the interchangeable lens 300 is attached and power is turned on for the first time, a battery usable time can be calculated at all operation modes when power is turned on for the second and subsequent times and information of the time can be displayed.

In addition, a series of processes described in the embodiment may be executed by dedicated hardware or may also be executed by software (applications). When the series of processes are executed by software, the series of processes may be realized by executing computer programs on a general-purpose or dedicated computer.

While the exemplary embodiments of the disclosure have been described in detail with reference to the accompanying drawings, the disclosure is not limited to the embodiments. It should be understood by those skilled in the art that various modifications or alternations can be made within the categories of the technical scope described in the appended claims and thus naturally belong to the technical scope of the disclosure.

For example, in the embodiment, information of a current integration value is transmitted to the interchangeable-lens system camera body from the battery pack 200, however, the disclosure is not limited to this example. That is, the microcontroller 105 of the interchangeable-lens system camera body 100 may sequentially receive information of a current value measured by the battery pack 200 from the battery pack 200, and the microcontroller 105 may calculate the information of a current integration value.

The present disclosure contains subject matter related to that disclosed in Japanese Priority Patent Application JP 2010-284584 filed in the Japan Patent Office on Dec. 21, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging apparatus, comprising:
    circuitry configured to:
    calculate a usable time of at least one battery device comprising a secondary battery,
    measure an average power level while at least one component of the imaging apparatus performs at a predetermined operation mode, wherein the power consumption of the at least one component is unknown in advance before power is supplied and after the at least one component is initially connected to the imaging apparatus, and
    calculate, when power is supplied for the second and subsequent times while the at least one component is continuously connected to the imaging apparatus, the usable time of the at least one battery device using the average power level and a current integration value, which is an integration value of current flowing.

2. The imaging apparatus according to claim 1, wherein the at least one component comprises an interchangeable lens.

3. The imaging apparatus according to claim 1, further comprising a display component configured to display information comprising the usable time of the at least one battery device.

4. The imaging apparatus according to claim 1, wherein the circuitry receives the current integration value from the at least one battery device.

5. The imaging apparatus according to claim 1, wherein the circuitry receives information of a current value of the current flowing during charging and discharging of the at least one battery device from at least the secondary battery and calculates the current integration value.

6. The imaging apparatus according to claim 1, wherein when the at least one component performs at another operation mode, which is one of a plurality of operation modes and is different from the predetermined operation mode, the circuitry calculates the average power level at the another operation mode using the average power level obtained at the predetermined operation mode.

7. The imaging apparatus according to claim 1, wherein when the at least one component performs at a plurality of operation modes, the circuitry calculates the average power level using an average power level obtained at each of the operation modes of the plurality of operation modes and an operation time ratio of each of the operation modes.

8. The imaging apparatus according to claim 1, wherein the circuitry stores the measured average power level and when a difference between another average power level obtained by measurement thereafter and the stored average power level is equal to or greater than a predetermined value, the circuitry determines that the at least one component is exchanged with another component.

9. A method of calculating usable time of an imaging apparatus comprising:
 calculating, using circuitry, a usable time of at least one battery device comprising a secondary battery;
 measuring, using the circuitry, an average power level while at least one component of the imaging apparatus performs at a predetermined operation mode, wherein the power consumption of the at least one component is unknown in advance before power is supplied and after the at least one component is initially connected to the imaging apparatus; and
 calculating, using the circuitry, when power is supplied for the second and subsequent times while the at least one component is continuously connected to the imaging apparatus, the usable time of the at least one battery device using the average power level and a current integration value, which is an integration value of current flowing.

10. The imaging apparatus according to claim 1, wherein the circuitry comprises at least one microcontroller.

11. The method according to claim 9, wherein the circuitry comprises at least one microcontroller.

12. The method according to claim 9, wherein the circuitry calculates the current integration value after receiving information of a current value of the current flowing during charging and discharging of the at least one battery device from at least the secondary battery.

* * * * *